(12) United States Patent
Stadter (10) Patent No.: US 11,942,926 B2
(45) Date of Patent: Mar. 26, 2024

(54) PROTECTION OF A SEMICONDUCTOR SWITCH

(71) Applicant: Siemens Aktiengesellschaft, Munich (DE)

(72) Inventor: Norbert Stadter, Buttenheim (DE)

(73) Assignee: Siemens Aktiengesellschaft, Munich (DE)

( * ) Notice: Subject to any disclaimer, the term of this patent is extended or adjusted under 35 U.S.C. 154(b) by 187 days.

(21) Appl. No.: 17/440,377

(22) PCT Filed: Feb. 17, 2020

(86) PCT No.: PCT/EP2020/054008
§ 371 (c)(1),
(2) Date: Sep. 17, 2021

(87) PCT Pub. No.: WO2020/187510
PCT Pub. Date: Sep. 24, 2020

(65) Prior Publication Data
US 2022/0158632 A1    May 19, 2022

(30) Foreign Application Priority Data
Mar. 18, 2019   (EP) .................... 19163391

(51) Int. Cl.
*H03K 17/0812*    (2006.01)
(52) U.S. Cl.
CPC . *H03K 17/08128* (2013.01); *H03K 17/08126* (2013.01)

(58) Field of Classification Search
CPC ....... H03K 17/08; H03K 17/081–0812; H03K 17/08122; H03K 17/08124;
(Continued)

(56) References Cited

U.S. PATENT DOCUMENTS

| 4,461,966 A | 7/1984 | Hebenstreit |
| 5,210,479 A * | 5/1993 | Kimura ................... H02P 27/08 361/93.7 |

(Continued)

FOREIGN PATENT DOCUMENTS

| DE | 3723786 A1 | 1/1989 |
| EP | 0053709 A2 | 6/1982 |

(Continued)

OTHER PUBLICATIONS

Takeshi Horiguchi et al: "A short circuit protection method based on a gate charge characteristic", 2014 International Power Electronics Conference (IPEC—Hiroshima 2014, ECCE Asia), pp. 2290-2296, XP055616689, DOI: 10.1109/IPEC.2014.6869909; ISBN: 978-1-4799-2705-0; pp. 2290-2296; Figure 7,8; 2014.

(Continued)

*Primary Examiner* — Thienvu V Tran
*Assistant Examiner* — Carlos O Rivera-Perez
(74) *Attorney, Agent, or Firm* — Henry M. Feiereisen LLC (57) ABSTRACT

A protection circuit for a semiconductor switch has a gate that can be controlled by a gate driver. The protection circuit includes an integrator for detecting a gate charge of the gate and a comparator unit for switching off the semiconductor switch in dependence on the value of the gate charge relative to a reference charge.

7 Claims, 9 Drawing Sheets

(58) Field of Classification Search
CPC ....... H03K 17/08126; H03K 17/08128; H03K 17/30; H03K 17/56; H03K 17/60; H03K 17/602; H03K 17/603; H02M 1/0009; H02M 1/0025; H02M 1/0048; H02M 1/0054; H02M 1/08; H02M 1/32; H02H 9/00; H02H 9/001; H02H 9/02–028
USPC .... 361/54, 56, 57, 78, 79, 86, 87, 93.1–102, 361/94; 323/271–278, 280–285, 289, 323/351; 363/50–58
See application file for complete search history.

(56) References Cited

U.S. PATENT DOCUMENTS

| | | |
|---|---|---|
| 5,285,346 A | 2/1994 | Davies et al. |
| 2004/0027762 A1 | 2/2004 | Ohi et al. |
| 2010/0231269 A1 | 9/2010 | Nakatake et al. |

FOREIGN PATENT DOCUMENTS

| | | |
|---|---|---|
| JP | 3066754 B2 | 7/2000 |
| JP | 2003125574 A | 4/2003 |

OTHER PUBLICATIONS

PCT International Search Report and Written Opinion of International Searching Authority dated Feb. 19, 2021 corresponding to PCT International Application No. PCT/EP2020/054008 filed Feb. 17, 2021.

\* cited by examiner

PROTECTION OF A SEMICONDUCTOR SWITCH

CROSS-REFERENCES TO RELATED APPLICATIONS

This application is the U.S. National Stage of International Application No. PCT/EP2020/054008, filed Feb. 17, 2020, which designated the United States and has been published as international Publication No. WO 2020/187510 A1 and which claims the priority of Europpean Patent Application, Serial No. 19163391.6, filed Mar. 18, 2019, pursuant to 35 U.S.C. 119(a)-(d).

BACKGROUND OF THE INVENTION

The invention relates to a protection circuit for a semiconductor switch having a gate which can be controlled by a gate driver, a circuit arrangement with a protection circuit of this type and a method for protecting a semiconductor switch against excessively high power dissipation.

The gate of a semiconductor switch denotes the control terminal of the semiconductor switch. The invention preferably serves for the protection of a voltage-controlled semiconductor switch, for example, a bipolar transistor with an insulated gate electrode (IGBT) or a metal oxide semiconductor field-effect transistor (MOSFET), which is controlled via a gate voltage, or a gate potential, applied to the gate. In the event of an excessively high power dissipation, for example, in the case of a short-circuit, the semiconductor switch can be damaged or destroyed. In order to avoid such damage, it must be ensured that, for example, in the event of a short-circuit, the gate voltage does not rise significantly above its specific switch-on value (maintaining the so-called safe operating area). Otherwise, the rise of the gate voltage can lead to an excessively high current through the semiconductor switch, for example, an excessively high collector current in the case of an IGBT or drain current in the case of a MOSFET and can raise the power dissipation too high.

In order to prevent an excessive increase in the power dissipation, for example, a voltage can be detected and monitored at a load terminal of the semiconductor switch, for example, the collector voltage in the case of an IGBT or the drain voltage in the case of a MOSFET, by means of a high voltage diode or an operational amplifier. Alternatively, a current through the semiconductor switch, can be detected and monitored, for example, with a shunt or a current transformer. However, these methods sometimes do not enable a sufficiently rapid switching-off of the semiconductor switch, since potential barriers have to be overcome, they are complex and expensive and/or have a large space requirement due to air clearance and leakage paths.

US 2004/0027762 A1 discloses a control circuit with a gate voltage detector which detects a gate-emitter voltage of a power semiconductor component over a detection period. The control circuit recognizes the occurrence of an irregularity in the power semiconductor component when the gate-emitter voltage exceeds a reference value.

The object underlying the invention is to protect a semiconductor switch against excessively high power dissipation levels with a gate which is controllable by a gate driver.

SUMMARY OF THE INVENTION

The object is achieved, according to the invention, by a protection circuit as set forth hereinafter, by a protection circuit as set forth hereinafter, by a circuit arrangement as set forth hereinafter, by a method as set forth hereinafter, and by a method as set forth hereinafter.

Advantageous embodiments of the invention are the subject matter of the subclaims.

A protection circuit according to the invention for a semiconductor switch with a gate controllable by a gate driver comprises an integrator for detecting a gate charge of the gate and a comparator unit for switching off the semiconductor switch dependent upon the value of the gate charge relative to a reference charge.

The invention makes use of the operational state of a voltage-controlled semiconductor switch (for example, a cut-off operation, saturated operation or linear operation) being able to be established on the basis of the gate charge of the gate of the semiconductor switch. A protection circuit according to the invention therefore has an integrator for detecting the gate charge. Furthermore, the protection circuit has a comparator unit with which the gate charge is compared with a reference charge. The reference charge is selected such that a gate charge signals, with the value of the reference charge, a critical operational state of the semiconductor switch. Therefore, the comparator unit is configured to switch off the semiconductor switch dependent upon the value of the gate charge relative to a reference charge—for example, to switch off the semiconductor switch when the gate charge reaches or falls below the value of the reference charge. A protection circuit according to the invention therefore enables the monitoring of the operational state of a semiconductor switch and switching off of the semiconductor switch if the operational state signaled by the gate charge requires it.

In a first embodiment of the protection circuit, the reference charge is time-independent (static) and the comparator unit is configured to switch off the semiconductor switch if the gate charge falls below the reference charge. Therein, the protection circuit has a timer element for setting a minimum duration (a so-called gating time) between a switching-on of the semiconductor switch and the switching-off of the semiconductor switch by the comparator unit. The minimum duration is selected such that during the minimum period, a gate capacitance and a Miller capacitance of the semiconductor switch after switching into a normal operation of the semiconductor switch are recharged at least approximately completely, for example to at least 90%. This takes into account that the gate charge following a switching-on of the semiconductor switch must be built up only by recharging the gate capacitance and Miller capacitance of the semiconductor switch until an assessment of the operational state of the semiconductor switch by a comparison of the gate charge with a static reference charge is possible.

The timer element has, for example, a timer element resistor, a timer element capacitor and a timer element diode. Herein, the anode of the timer element diode is connected to a first terminal of the timer element resistor and a first electrode of the timer element capacitor and an output of the integrator is connected to the cathode of an output diode, the anode of which is connected to the anode of the timer element diode, the first terminal of the timer element resistor and the first electrode of the timer element capacitor. The minimum duration for a switching-off after a switching-on of the semiconductor switch is set here by the resistance value of the timer element resistor and the capacitance of the timer element capacitor. This design of the timer element is particularly economical since only a resistor and a capacitor are used.

In order to realize a protection circuit with a static reference charge, the comparator unit has, for example, an npn-bipolar transistor, a pnp-bipolar transistor, two comparator diodes, a comparator capacitor and three comparator resistors. Therein, the collector of the npn-bipolar transistor is connected to the base of the pnp-bipolar transistor, the collector of the pnp-bipolar transistor is connected to the base of the npn-bipolar transistor and the anode of a first comparator diode, the comparator capacitor and a first comparator resistor are each connected in parallel with the base-emitter path of the pnp-bipolar transistor, the second comparator resistor is connected in parallel with the base-emitter path of the npn-bipolar transistor, the cathode of the first comparator diode is connected to the anode of the output diode, the emitter of the npn-bipolar transistor is connected to the second electrode of the timer element capacitor, the emitter of the pnp-bipolar transistor is connected via the third comparator resistor to the second terminal of the timer element resistor, and the base of the pnp-bipolar transistor is connected to the cathode of the second comparator diode. In this design of the comparator unit, the pnp-bipolar transistor and the npn-bipolar transistor are connected into a thyristor structure, by way of the triggering of which the semiconductor switch is switched off. The first comparator diode is, for example, a Z-diode, the Zener voltage of which defines the reference charge for triggering the thyristor structure.

In a second embodiment of the invention, the protection circuit has a reference charge circuit by means of which the reference charge is increased after a switching-on of the semiconductor switch during a rise time from zero to a final value, wherein the comparator unit is configured to switch off the semiconductor switch when the gate charge falls below the reference charge. The rise time is selected, for example, such that a gate capacitance and a Miller capacitance of the semiconductor switch after the elapse of the rise time following a switching into a normal operation of the semiconductor switch are recharged at least approximately completely, for example, to at least 90%.

In the aforementioned embodiment of the protection circuit, the reference charge is therefore not realized statically, but is increased gradually after the switching-on of the semiconductor switch to an end value. By this means, as distinct from the embodiment with a static reference charge after a switching-on of the semiconductor switch, no minimum time has to be waited until a comparison of the gate charge with the reference charge can take place. This enables, in particular, an early detection of a short-circuit and a correspondingly early switching-off of the semiconductor switch, for example, within 2 μs after the switching-on of the semiconductor switch.

In order to realize a protection circuit with a dynamic reference charge of this type, the comparator unit has, for example, a comparator operational amplifier and a comparator diode and the reference charge circuit has, for example, a reference charge capacitor, a reference charge resistor and two reference charge diodes. Therein, the positive input of the comparator operational amplifier is connected to the output of the integrator, the negative input of the comparator operational amplifier is connected to a first terminal of the reference charge resistor, a first electrode of the reference charge capacitor and the anode of a first reference charge diode, the output of the comparator operational amplifier is connected to the cathode of the comparator diode, the cathode of the first reference charge diode is connected to the cathode of the second reference charge diode, and the anode of the second reference charge diode is connected to the input of the integrator. In this embodiment of the protection circuit, the reference charge is created dynamically by the charging of the reference charge capacitor. The final value of the reference charge is defined by the properties of the reference charge diodes. The rise time for building up the reference charge is set by the resistance value of the reference charge resistor and the capacitance of the reference charge capacitor. The comparator operational amplifier enables a comparison of the gate charge with the reference charge and a switching-off of the semiconductor switch by means of the output voltage of the comparator operational amplifier via the comparator diode.

A circuit arrangement according to the invention comprises a semiconductor switch with a gate, a gate driver for controlling the gate and a protection circuit according to the invention. The gate driver has an electronic switch unit which is controllable by a driver voltage of the gate driver, to which the gate is connected to switch on the semiconductor switch with a switch-on potential and for switching off the semiconductor switch with a switch-off potential. The advantages of a circuit arrangement according to the invention arise from the aforementioned advantages of a protection circuit according to the invention.

In the aforementioned embodiment of the protection circuit with a static reference charge, the emitter of the npn-bipolar transistor is connected to the switch-off potential, the second terminal of the timer element resistor is connected to the switch-on potential and the anode of the second comparator diode is connected to a control input of the electronic switch unit.

In the aforementioned embodiment of the protection circuit with a dynamic reference charge, the second terminal of the reference charge resistor is connected to the switch-on potential, the second electrode of the reference charge capacitor is connected to the switch-off potential and the anode of the comparator diode is connected to a control input of the electronic switch unit.

In a method according to the invention for protecting a semiconductor switch with a gate controllable by a gate driver, a gate charge of the gate is detected and the semiconductor switch is switched off dependent upon the value of the gate charge relative to a reference charge.

In accordance with the first embodiment mentioned above of a protection circuit according to the invention, the reference charge in a first method variant is time-independent and the semiconductor switch is switched off if, after the elapsing of a minimum duration after a switching-on of the semiconductor switch, the gate charge falls below the reference charge.

In accordance with the second embodiment mentioned above of a protection circuit according to the invention, the reference charge in a second method variant is increased after a switching-on of the semiconductor switch during a rise time from zero to an end value and the semiconductor switch is switched off if the gate charge falls below the reference charge.

BRIEF DESCRIPTION OF THE DRAWING

The above-described properties, features and advantages of this invention and the manner in which these are achieved will now be described more clearly and intelligibly in relation to exemplary embodiments, which are explained in further detail by reference to the drawings, in which.

DETAILED DESCRIPTION OF PREFERRED EMBODIMENTS

Parts which correspond to one another are provided with the same reference characters in the figures.

Figure 1:
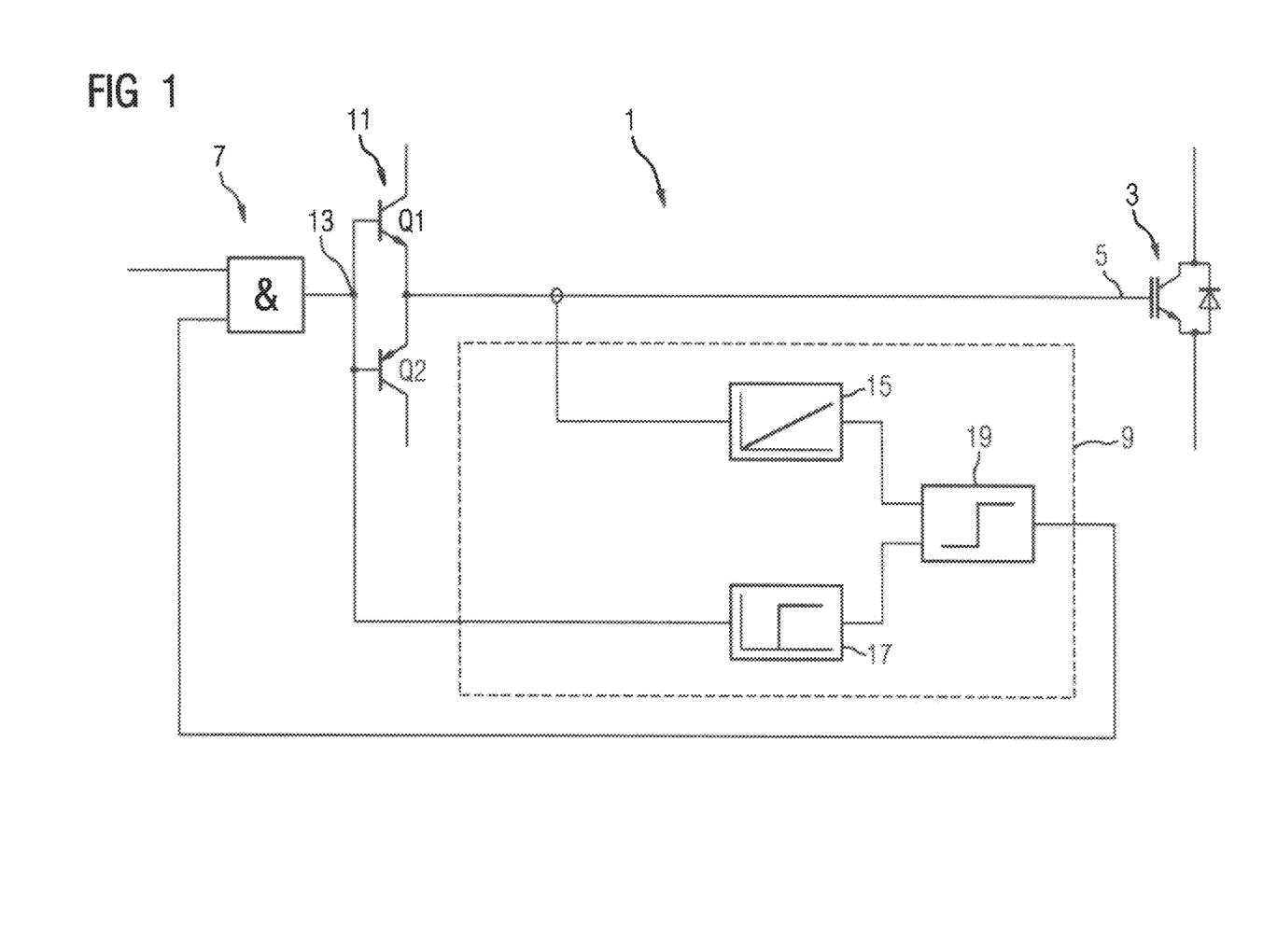
FIG. 1 shows a block circuit diagram of a first exemplary embodiment of a circuit arrangement according to the invention.

FIG. 1 shows a block circuit diagram of a first exemplary embodiment of a circuit arrangement 1 according to the invention, The circuit arrangement 1 comprises a semiconductor switch 3 with a gate 5, a gate driver 7 for controlling the gate 5 and a first exemplary embodiment of a protection circuit 9 according to the invention. The semiconductor switch 3 of this exemplary embodiment is an IGBT.

The gate driver 7 has an electronic switch unit 11 with a push-pull output stage having output stage bipolar transistors Q1, Q2 and a control input 13.

The protection circuit 9 comprises an integrator 15, a timer element 17 and a comparator unit 19. According to a first variant of the method according to the invention, a gate charge of the gate 5 is detected by the integrator 15, with the timer element 17, a minimum duration to the switching-off of the semiconductor switch 3 after a switching-on of the semiconductor switch 3 is set and with the comparator unit 19, the semiconductor switch 3 is switched off when, after the elapse of the minimum duration following a switching-on of the semiconductor switch, the gate charge falls below the reference charge. The reference charge is therein time-independent. The minimum duration is selected such that, during the minimum duration, a gate capacitance and a Miller capacitance of the semiconductor switch after switching into a normal operation of the semiconductor switch are recharged at least approximately completely, for example to at least 90%. The semiconductor switch 3 is switched off by the comparator unit 19 in a lasting manner or only for one clock cycle of the gate driver 7.

Figure 2:
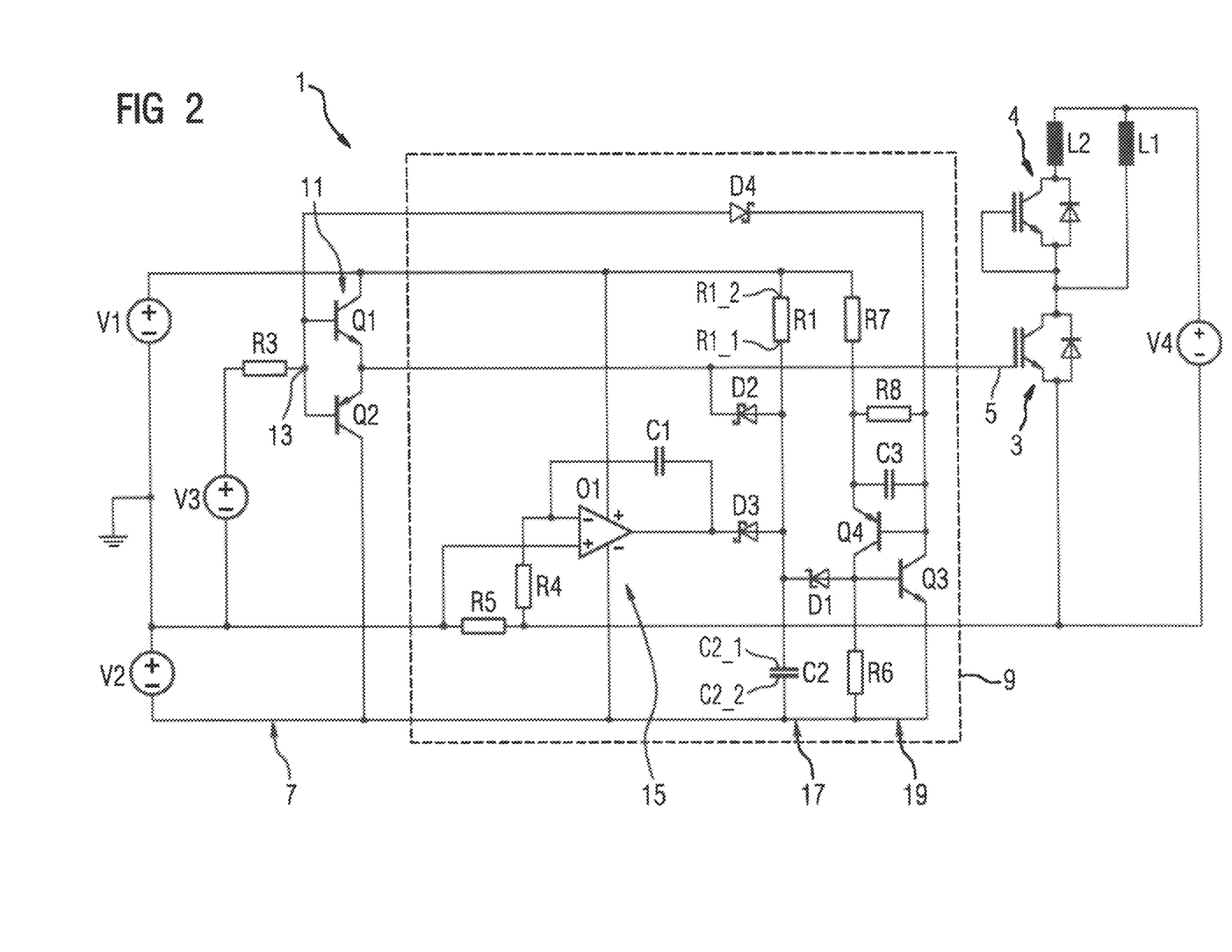
FIG. 2 shows a circuit diagram of a circuit arrangement according to the invention in accordance with the first exemplary embodiment.

FIG. 2 shows a circuit diagram of a circuit arrangement 1 according to the first exemplary embodiment.

With the electronic switching unit 11 of the gate driver 7, to switch on the semiconductor switch 3, the gate 5 is connected to a switch-on potential and to switch off the semiconductor switch, the gate is connected to a switch-off potential. The switch-on potential is generated by a switch-on voltage source V1. The switch-off potential is generated by a switch-off voltage source V2. The electronic switching unit 11 is controlled by a driver voltage. The driver voltage is applied by a driver voltage source V3 via a driver resistor R3 to the control input 13 of the electronic switching unit 11. The voltage sources V1, V2, V3 are each DC sources.

The integrator 15 of the protection circuit 9 has an integrator operational amplifier O1, an integrator capacitor C1 and an integrator resistor R4. The integrator capacitor C1 and the integrator resistor R4 set the time constant of the integrator 15. The integrator 15 detects the gate charge via a voltage drop across a measuring resistor R5. The measuring resistor R5 is connected to the emitter of the semiconductor switch 3 and is also used in this exemplary embodiment as a gate resistor. Alternatively, the measuring resistor R5 can be arranged in the gate line of the semiconductor switch 3, although this places greater demands on the integrator 15, since the measuring resistor R5 then lies alternatingly at the switch-on potential and the switch-off potential. Furthermore, in addition to the measuring resistor R5 as arranged in FIG. 2, a separate gate resistor R2 (see FIG. 5) can be connected into the gate line of the semiconductor switch 3.

The timer element 17 has a timer element resistor R1, a timer element capacitor C2 and a timer element diode D2. The anode of the timer element diode D2 is connected to a first terminal R1_1 of the timer element resistor R1 and a first electrode C2_1 of the timer element capacitor C2. The output of the integrator 15 is connected to the cathode of an output diode D3, the anode of which is connected to the anode of the timer element diode D2, the first terminal R1_1 of the timer element resistor R1 and the first electrode C2_1 of the timer element capacitor C2.

The comparator unit 19 has an npn-bipolar transistor Q3, a pnp-bipolar transistor Q4, a first comparator diode D1, a second comparator diode D4, a comparator capacitor C3, a first comparator resistor R8, a second comparator resistor R6 and an optional third comparator resistor R7.

The collector of the npn-bipolar transistor Q3 is connected to the base of the pnp-bipolar transistor Q4. The collector of the pnp-bipolar transistor Q4 is connected to the base of the npn-bipolar transistor Q3 and the anode of the first comparator diode D1. The comparator capacitor C3 and the first comparator resistor R8 are each connected in parallel with the base-emitter path of the pnp-bipolar transistor Q4. The second comparator resistor R6 is connected in parallel with the base-emitter path of the npn-bipolar transistor Q3. The cathode of the first comparator diode D1 is connected to the anode of the output diode D3. The emitter of the npn-bipolar transistor Q3 is connected to the second electrode C2_2 of the timer element capacitor C2. The emitter of the pnp-bipolar transistor Q4 is connected via the third comparator resistor R7 to the second terminal R1_2 of the timer element resistor R1. The base of the pnp-bipolar transistor Q4 is connected to the cathode of the second comparator diode D4.

The emitter of the npn-bipolar transistor Q3 is connected to the switch-off potential, that is, the negative terminal of the switch-off voltage source V2. The second terminal R1_2 of the timer element resistor R1 is connected to the switch-on potential, that is, the positive terminal of the switch-on voltage source V1. The anode of the second comparator diode D4 is connected to the control input 13 of the electronic switching unit 11.

Figure 3:
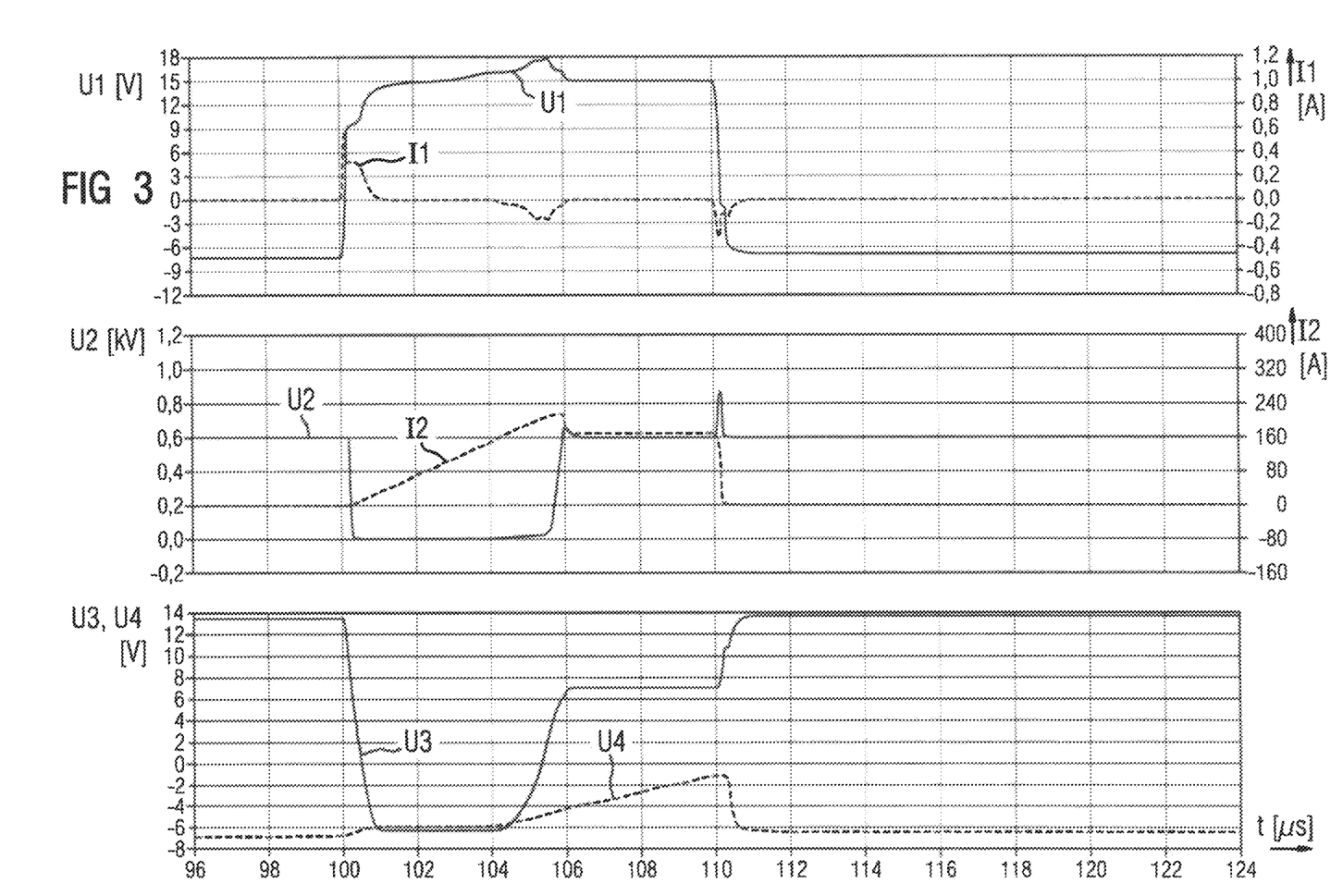
FIG. 3 shows variations over time of currents and voltages of the circuit arrangement shown in FIG. 2.

FIG. 3 shows variations of currents I1, I2 and voltages U1 to U4 of the circuit arrangement 1 shown in FIG. 2, dependent upon a time t in the case that the semiconductor switch 3 reaches its desaturation limit after the switch-on. The variations were generated with a simulation in which the semiconductor switch 3 is connected, as shown in FIG.

2, to a second semiconductor switch 4 to form a half-bridge and a load connected to the half-bridge has been simulated by a load inductance L1, a leakage inductance L2 and a load voltage source V4. The load voltage source V4 is a DC voltage source. The leakage inductance L2 is connected in series with the second semiconductor switch 4. The load inductance L1 is connected in parallel with the series connection of the leakage inductance L2 and the second semiconductor switch 4.

The simulation was carried out for a measuring resistor R5 of 10Ω, a driver resistor R3 of 1.5 kΩ, an integrator capacitor C1 with a capacitance of 500 pF, an integrator resistor R4 of 220Ω, a timer element resistor R1 of 2.2 kΩ, a timer element capacitor C2 with a capacitance of 10 nF, a comparator capacitor C3 with a capacitance of 2 nF, a first comparator resistance R8 of 470Ω, a second comparator resistance R6 of 470Ω, a third comparator resistor R7 of 2.2 kΩ, a load inductance L1 of 15 µH, a leakage inductance L2 of 150 nH, a switch-on voltage source V1 von 15 V, a switch-off voltage source V2 of 8 V, a load voltage source V4 of 600 V, diodes D2, D3, D4 designed as Schottky diodes and a diode D1 designed as a Z-diode.

Approximately 100 µs after the start of the simulation, the semiconductor switch 3 is switched on. Thereupon, a gate-emitter voltage U1, a gate current I1 and a collector current I2 of the semiconductor switch 3 all rise and a collector voltage U2 of the semiconductor switch 3 falls rapidly to approximately 0 V. At the same time, an integrator output voltage U3 at the output of the negating integrator operational amplifier O1 falls and a control signal U4 which is a voltage between the electrodes C2_1, C_2 of the timer element capacitor C2 rises. Shortly after the switching-on of the semiconductor switch 3, the gate current I1 falls again to 0 A. After the gate current I1 has fallen again to 0 A, the integrator output voltage U3 and the control signal U4 initially remain constant. However, the gate-emitter voltage U1 and the collector current I2 rise further.

Approximately 104.5 µs after the start of the simulation, the semiconductor switch 3 again reaches its desaturation limit and the collector voltage U2 rises again (initially only slowly). Thereupon, the Miller capacitance of the semiconductor switch 3 begins to charge up and the gate current I1 begins to flow in the opposite direction (it flows back into the gate 5). The reverse-flowing gate current I1 causes the integrator output voltage U3 to rise.

Approximately 106 µs after the start of the simulation, the Miller capacitance of the semiconductor switch 3 is fully charged, the gate current I1 is 0 A again and the integrator output voltage U3 and the collector voltage U2 each assume constant values. However, the control signal U4 rises further. Approximately 110 µs after the start of the simulation, the first electrode C2_1 of the timer element capacitor C2 reaches a voltage at which the first comparator diode D1 and the base-emitter path of the npn-bipolar transistor Q3 become conductive. Finally, the thyristor structure formed by the npn-bipolar transistor Q3 and the pnp-bipolar transistor Q4 is switched off via the first comparator diode D1 and the semiconductor switch 3. Here, the Zener voltage of the first comparator diode D1 defines the reference charge. The third comparator resistor R7 of the circuit arrangement 1 shown in FIG. 2 causes the semiconductor switch 3 to be switched off in a lasting manner. If the third comparator resistor R7 is removed, the semiconductor switch 3 is switched off for only one clock cycle of the gate driver 7.

Figure 4:
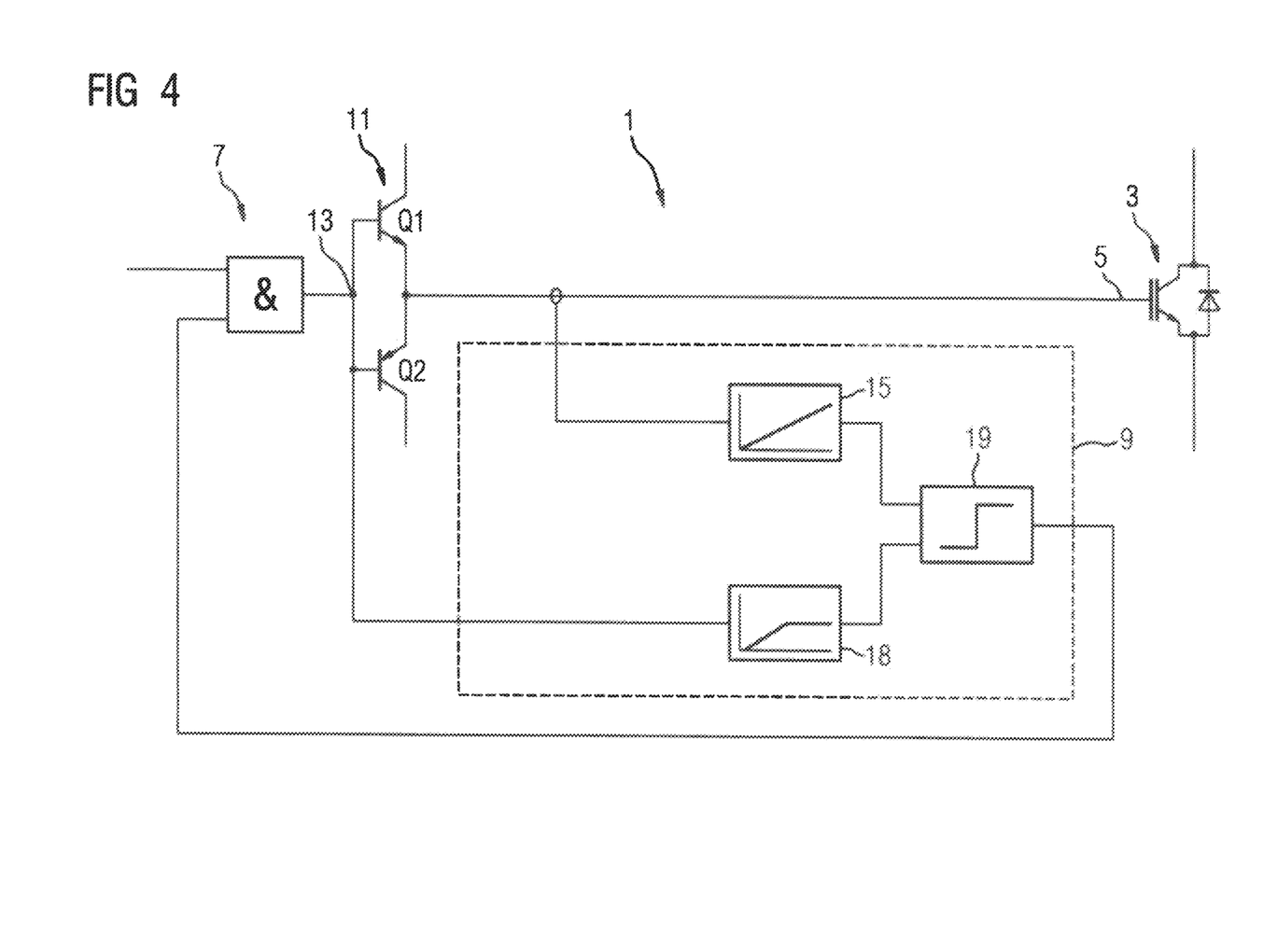
FIG. 4 shows a block circuit diagram of a second exemplary embodiment of a circuit arrangement according to the invention.

FIG. 4 shows a block circuit diagram of a second exemplary embodiment of a circuit arrangement 1 according to the invention.

The circuit arrangement 1 of this exemplary embodiment differs from the circuit arrangement 1 shown in FIG. 1 in that it has no timer element 17, but rather has a reference charge circuit 18. According to a second variant of the method according to the invention, a gate charge of the gate 5 is detected by the integrator 15, with the reference charge circuit 18, a reference charge is increased after a switching-on of the semiconductor switch 3 during a rise time from zero to an end value and the semiconductor switch 3 is switched off with the comparator unit 19 when the gate charge falls below the reference charge. The rise time is selected such that, during the minimum duration, a gate capacitance and a Miller capacitance of the semiconductor switch are recharged at least approximately completely, for example to at least 90%, after the elapse of the rise time after a switching of the semiconductor switch 3 into a normal operating mode. The semiconductor switch 3 is switched off by the comparator unit 19 for one clock cycle of the gate driver 7.

Figure 5:
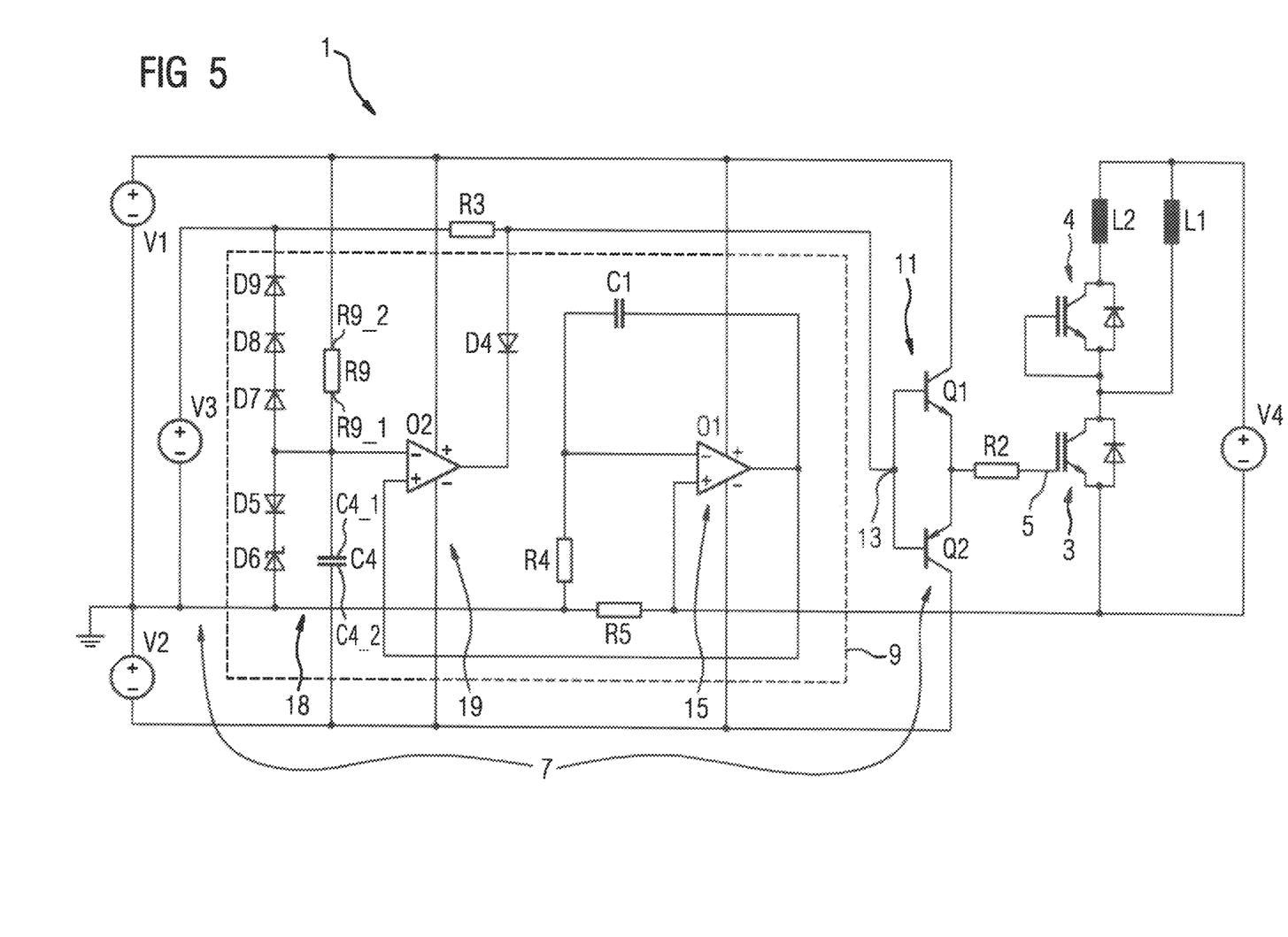
FIG. 5 shows a circuit diagram of a circuit arrangement according to the invention in accordance with the second exemplary embodiment.

FIG. 5 shows a circuit diagram of a circuit arrangement 1 according to the second exemplary embodiment.

The gate driver 7 and the integrator 15 are configured as in the circuit arrangement 1 shown in FIG. 2. The integrator 15 detects the gate charge via a voltage drop across a measuring resistor R5. The measuring resistor R5 is connected to the emitter of the semiconductor switch 3. The gate driver 7 is connected to the gate 5 of the semiconductor switch 3 via a gate resistor R2. In an alternative embodiment of the circuit arrangement 1, the measuring resistor R5 can be dispensed with and the voltage for the integrator 15 can be tapped off at the gate resistor R2 (see also the comments in the description regarding FIG. 2).

The comparator unit 19 has a comparator operational amplifier O2 and a comparator diode D4. The reference charge circuit 18 has a reference charge capacitor C4, a reference charge resistor R9, and a first reference charge diode D5 and a second reference charge diode D6, which is a Z-diode. The positive input of the comparator operational amplifier O2 is connected to the output of the integrator 15. The negative input of the comparator operational amplifier O2 is connected to a first terminal R9_1 of the reference charge resistor R9, a first electrode C4_1 of the reference charge capacitor C4 and the anode of the first reference charge diode D5. The output of the comparator operational amplifier O2 is connected to the cathode of the comparator diode D4. The cathode of the first reference charge diode D5 is connected to the cathode of the second reference charge diode D6. The anode of the second reference charge diode D6 is connected to the input of the integrator 15. Furthermore, the anode of the first reference charge diode D5 is connected via a series connection from the resetting diodes D7, D8, D9 to the positive terminal of the driver voltage source V3.

The second terminal R9_2 of the reference charge resistor R9 is connected to the switch-on potential, that is, the positive terminal of the switch-on voltage source V1. The second electrode C4_2 of the reference charge capacitor C4 is connected to the switch-off potential, that is, to the negative terminal of the switch-off voltage source V2. The anode of the comparator diode D4 is connected to a control input 13 of the electronic switching unit 11.

In the circuit arrangement 1 shown in FIG. 5, in contrast to the exemplary embodiment shown in FIG. 2, the integrator 15 does not function in a negating manner. The reference charge resistor R9 and the reference charge capacitor C4 set the rise time within which the reference charge rises after the switching-on of the semiconductor switch 3 to its final value.

The final value is reached when the voltage on the reference charge capacitor C4 reaches the sum of the forward voltage of the first reference charge diode D5 and the Zener voltage of the second reference charge diode D6. After reaching the final value, the voltage on the reference charge capacitor C4 remains constant. After the switching-on of the semiconductor switch 3, the gate charge of the gate 5, which is measured with the integrator 15 and is compared with the reference charge by means of the comparator operational amplifier O2, rises. In fault-free operation of the semiconductor switch 3, the gate charge is always higher than the reference charge. In the event of a fault, the gate charge falls below the reference charge and the semiconductor switch 3 is switched off by the comparator unit 19. The reset diodes D7, D8, D9 serve for rapid resetting of the reference charge after a switching-off of the semiconductor switch 3.

Figure 6:
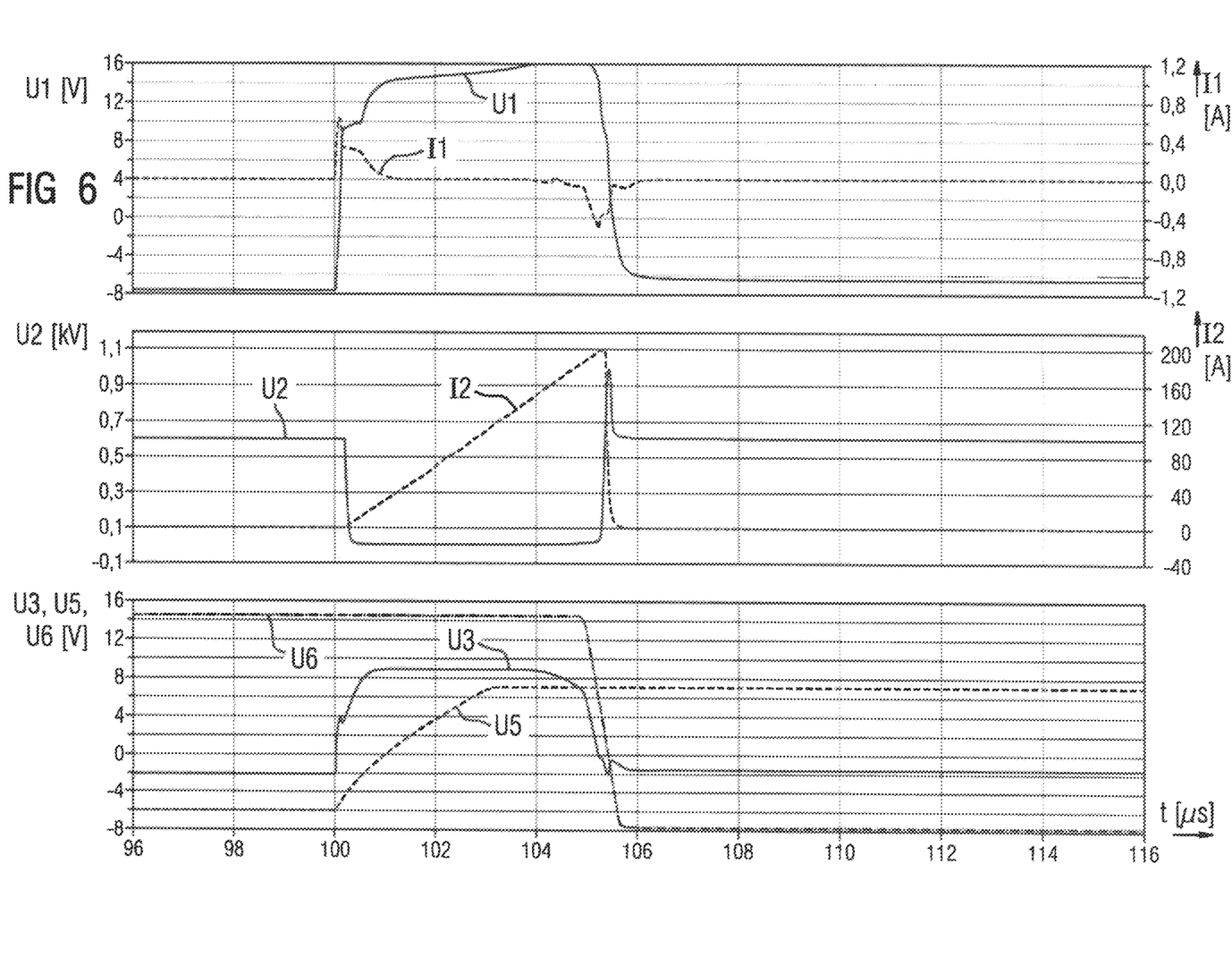
FIG. 6 shows first variations over time of currents and voltages of the circuit arrangement shown in FIG. 5.

FIG. 6 shows temporal variations of currents I1, I2 and voltages U1 to U3, U5, U6 of the circuit arrangement 1 shown in FIG. 5, in the case that the semiconductor switch 3 reaches its desaturation limit after the switching-on. The variations were generated with a simulation in which the semiconductor switch 3 is connected, as shown in FIG. 2, to a second semiconductor switch 4 to form a half-bridge and a load connected to the half-bridge was simulated by inductances L1, L2 and a load voltage source V4.

The simulation was carried out for a measuring resistor R5 of 6.8Ω, a driver resistor R3 of 1 kΩ, a gate resistor R2 of 6.8Ω an integrator capacitor C1 with a capacitance of 100 pF, an integrator resistor R4 of 1.5 kΩ, a reference charge capacitor C4 with a capacitance of 620 pF, a reference charge resistor R9 of 4.7 kΩ, a load inductance L1 of 15 µH, a leakage inductance L2 of 150 nH, a switch-on voltage source V1 von 15 V, a switch-off voltage source V2 of 8 V, and a load voltage source V4 of 600 V.

Approximately 100 µs after the start of the simulation, the semiconductor switch 3 is switched on. Thereupon, the gate-emitter voltage U1 rises, the gate current I1 rises briefly, a collector current I2 of the semiconductor switch 3 rises and the collector voltage U2 of the semiconductor switch 3 falls rapidly to approximately 0 V. At the same time, the integrator output voltage U3 at the output of the non-negating integrator operational amplifier O1 and a reference voltage U5 applied to the negative input of the comparator operational amplifier O2, which is a measure for the reference charge, rise, wherein the integrator output voltage U3 is greater than the reference voltage U5 since the gate charge is greater than the reference charge.

Approximately 104.5 µs after the start of the simulation, the semiconductor switch 3 again reaches its desaturation limit and the collector voltage U2 rises again (initially only slowly). Thereupon, the Miller capacitance of the semiconductor switch 3 begins to charge up and the gate current I1 begins to flow in the opposite direction (it flows back into the gate 5). The reverse-flowing gate current I1 causes the integrator output voltage U3 to fall.

Approximately 105 µs after the beginning of the simulation, the integrator output voltage U3 falls below the reference voltage U5, since the gate charge falls below the reference charge. This is detected by the comparator operational amplifier O2 and a comparator output voltage U6 at the output of the comparator operational amplifier O2 falls to the switch-off voltage of −8 V, whereby the semiconductor switch 3 is switched off. As distinct from the simulation shown in FIG. 3, in this case a desaturation of the semiconductor switch 3 does not take place since no minimum duration is waited before the switching-off of the semiconductor switch 3, so that the semiconductor switch 3 is switched off faster.

Figure 7:
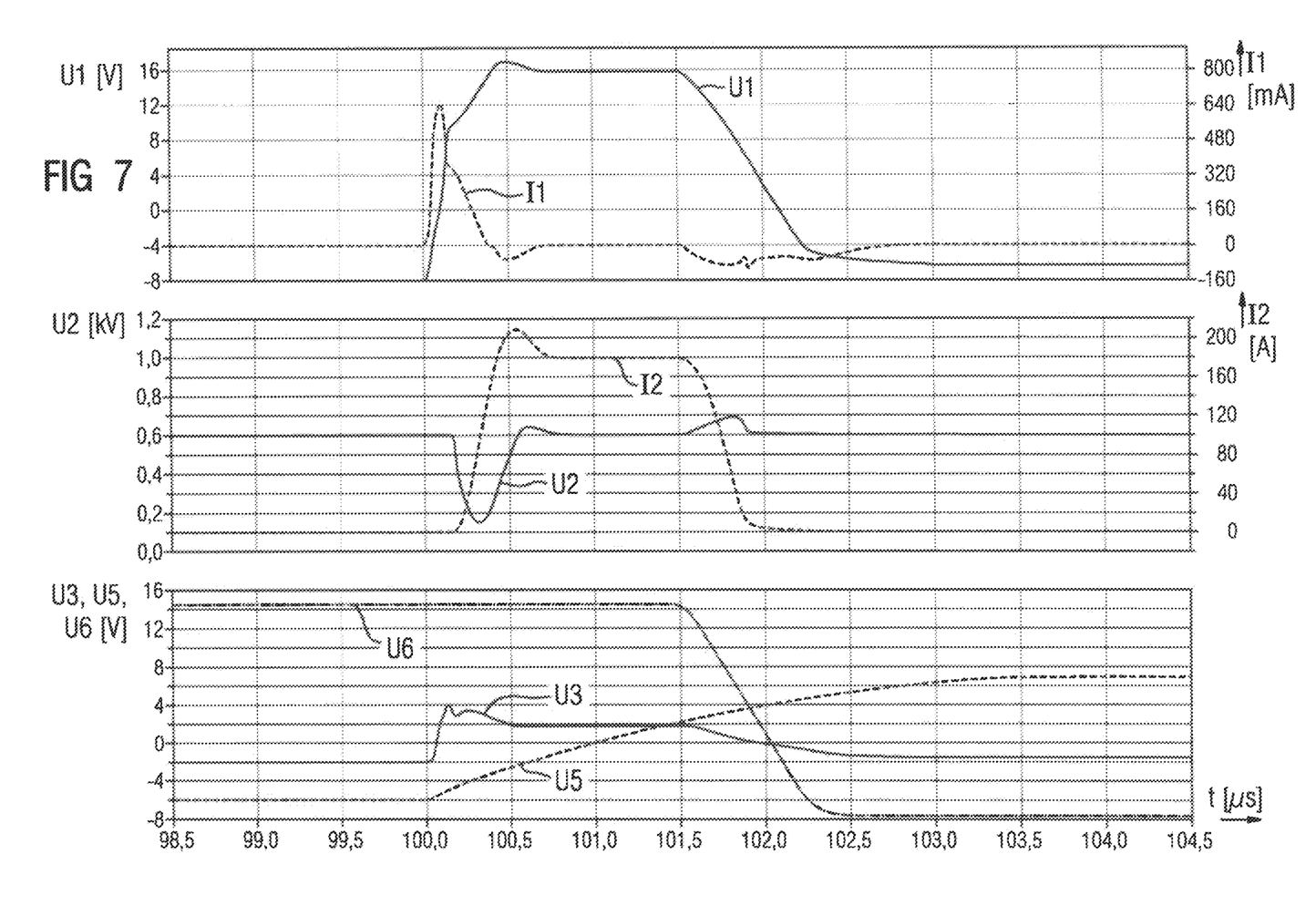
FIG. 7 shows second variations over time of currents and voltages of the circuit arrangement shown in FIG. 5.

FIG. 7 shows temporal variations of the currents I1, I2 and the voltages U1 to U3, U5, U6 of the circuit arrangement 1 shown in FIG. 5, whereby these variations have been carried out with a simulation for a load inductance L1 of 0.5 µH, whereas all further parameters of the simulation have been selected as in the simulation shown in FIG. 6. As distinct from the simulation shown in FIG. 6, in this case, the collector voltage U2 does not reach the saturation level and the Miller capacitance of the semiconductor switch 3 is barely charged. The gate charge and the integrator output voltage U3 therefore rise after the switching-on of the semiconductor switch 3 to less high values than in the simulation shown in FIG. 6, so that the integrator output voltage U3 falls below the reference voltage U5 sooner and the comparator 19 then switches off the semiconductor switch 3. The collector current I2 lasts less than 2 µs (approximately 1.7 µs). This shows that the second exemplary embodiment shown in FIG. 5 of a protection circuit 9 according to the invention can bring about a very rapid switching-off of a semiconductor switch 3 with a small load inductance L1.

Figure 8:
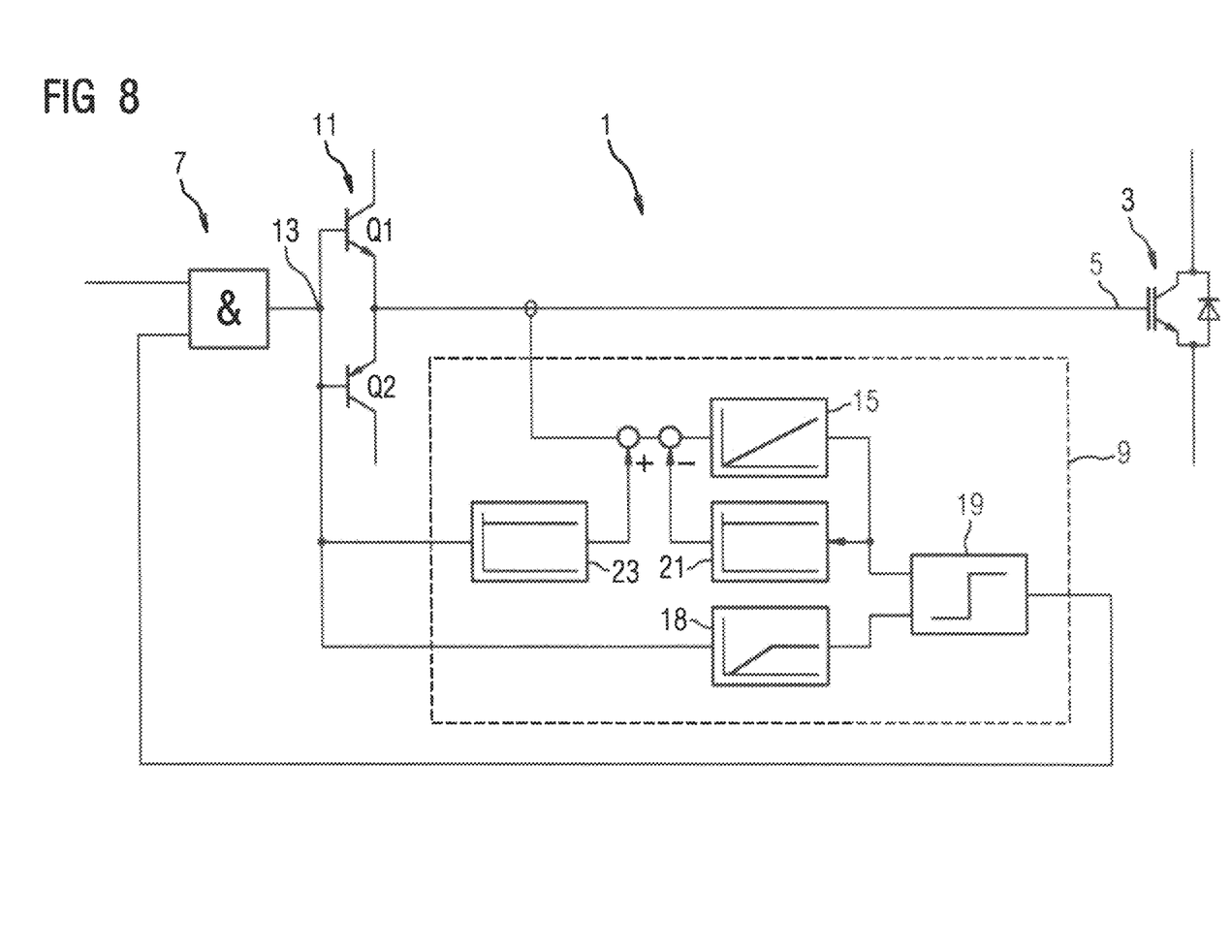
FIG. 8 shows a block circuit diagram of a third exemplary embodiment of a circuit arrangement according to the invention.

FIG. 8 shows a block circuit diagram of a third exemplary embodiment of a circuit arrangement 1 according to the invention. This exemplary embodiment differs from the exemplary embodiment shown in FIG. 4 only in that the protection circuit 9 has two P-elements 21, 23 for compensation of an input offset voltage of the integrator 15. A first P-element 21 is connected between the output and the negative input of the integrator 15. The second P-element 23 is connected between the positive input of the integrator 15 and the control input 13 of the electronic switching unit 11 of the gate driver 7.

The P-elements 21, 23 prevent an input offset voltage at an input of the integrator operational amplifier O1 leading to an undesirable drifting of the output voltage of the integrator operational amplifier O1. The P-elements 21, 23 are dimensioned so that the input offset voltage is compensated for and the drift of the output voltage maintains a sufficient margin from a supply voltage of the integrator operational amplifier O1 to ensure its reliable functioning.

The first P-element 21 provides, with an inverted feedback of the integrator output signal to the input of the integrator 15, that the integrator 15 cannot enter into the boundary. The amplification of the integrator output signal by the first P-element 21 is kept so low by a high-ohmic resistor that an error is slowly balanced out. This feedback alone would cause the integrator 15 to return slowly back to zero. In order to prevent this, the driver signal is provided at the control input 13 of the electronic switching unit 11 of the gate driver 7 also with a low amplification of the second P-element 23 in a non-inverting manner to the input of the integrator 15. The integrator 15 is thus forced to pause for the switching-on and switching-off to predefined values with a long integration constant in each case. An input-offset voltage of the integrator operational amplifier O1 displaces these values to a certain level provided the first P-element 21 permits this. The integration constant of the integrator 15 is selected so that each complete recharging of the gate 5 causes the output of the integrator 15 to "jump" alternatingly exactly to these two predefined values. Rapid processes such as the desaturation of the semiconductor switch 3 are not compensated for by the P-elements 21, 23 and are processed faithfully.

Summarizing, an input-offset voltage of the integrator operational amplifier O1 is compensated for by the P-elements 21, 23 with a tolerable residual deviation, while rapid processes such as the recharging of the gate 5 or the desaturation of the semiconductor switch 3 are not affected by the compensation.

Figure 9:
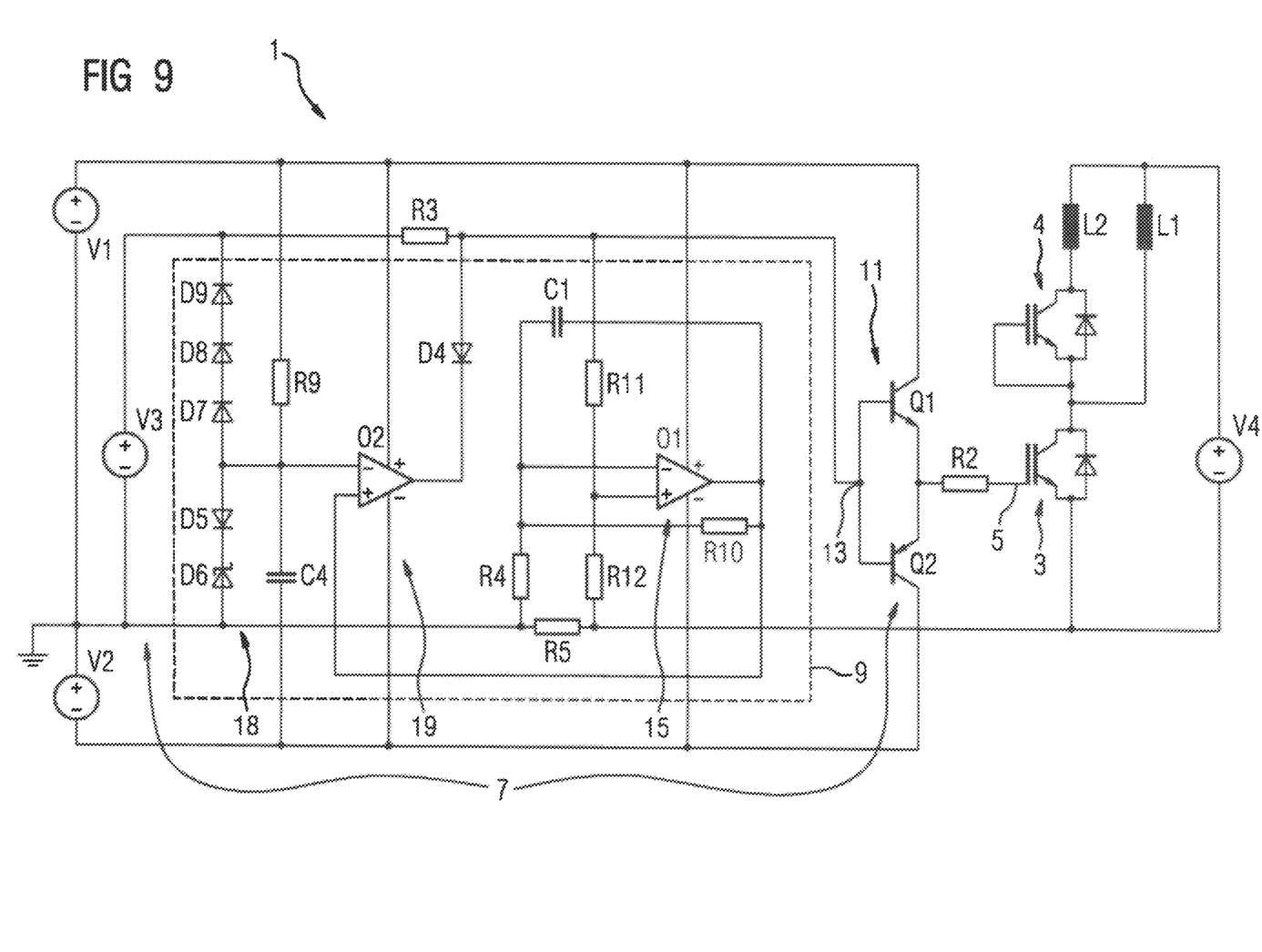
FIG. 9 shows a circuit diagram of a circuit arrangement according to the invention in accordance with the third exemplary embodiment.

FIG. 9 shows a circuit diagram of a circuit arrangement 1 according to the third exemplary embodiment. The circuit arrangement 1 differs from the circuit arrangement 1 shown in FIG. 5 only by three P-element resistors R10, R11, R12. A first P-element resistor R10 is connected between the output and the negative input of the integrator operational amplifier O1. A second P-element resistor R11 is connected between the positive input of the integrator operational amplifier O1 and the control input 13 of the electronic switching unit 11 of the gate driver 7. The third P-element resistor R12 is connected between the emitter of the semiconductor switch 3 and the positive input of the integrator operational amplifier O1. The first P-element resistor R10 has, for example, a resistance value of approximately 2000 kΩ, the second P-element resistor R11 has, for example, a resistance value of approximately 300 kΩ, the third P-element resistor R12 has, for example, a resistance value of approximately 100Ω. The first P-element resistor R10 and the integrator resistor R4 form the first P-element 21, the second P-element resistor R11 and the third P-element resistor R12 form the second P-element 23 (see FIG. 8).

All the exemplary embodiments shown in FIGS. 1 to 9 of a circuit arrangement 1 according to the invention can similarly also be configured with a MOSFET rather than an IGBT as the semiconductor switch 3 and/or with a differently configured gate driver 7, for example, a gate driver 7 the electronic switching unit 11 of which has an output stage with a complementary output stage MOSFET rather than a push-pull output stage with output stage bipolar transistors Q1, Q2.

Although the invention has been illustrated and described in detail on the basis of preferred exemplary embodiments, the invention is not restricted by the examples given and other variations can be derived therefrom by a person skilled in the art without departing from the protective scope of the invention.

The invention claimed is:

1. A protection circuit for a semiconductor switch, the semiconductor switch having a gate which is controllable by a gate driver, the protection circuit comprising:
an integrator connected to the gate and detecting a gate charge of the gate based on an integrator output voltage of the integrator,
a comparator unit for switching off the semiconductor switch when the gate charge falls below a time-independent reference charge, the comparator unit comprising a pnp-bipolar transistor, an npn-bipolar transistor having a collector connected to a base of the pnp-bipolar transistor, a first comparator diode, a second comparator diode, a comparator capacitor, a first comparator resistor, a second comparator resistor and a third comparator resistor and to an anode of the first comparator diode, with the comparator capacitor and the first comparator resistor each connected in parallel with a base-emitter path of the pnp-bipolar transistor, and with the second comparator resistor connected in parallel with a base-emitter path of the npn-bipolar transistor, and
a timer element for setting a minimum duration between a switching-on of the semiconductor switch by the comparator unit and a switching-off of the semiconductor switch by the comparator unit, wherein the minimum duration is selected such that, during the minimum duration, a gate capacitance and a Miller capacitance of the semiconductor switch, after the semiconductor switch into a normal operation, are substantially completely, but at least 90%, recharged,
wherein the timer element comprises a timer element resistor, a timer element capacitor and a timer element diode, wherein an anode of the timer element diode is connected to a first terminal of the timer element resistor and to a first electrode of the timer element capacitor, and an output of the integrator is connected to a cathode of an output diode, with an anode of the output diode being connected to the anode of the timer element diode, to the first terminal of the timer element resistor and to the first electrode of the timer element capacitor, and
wherein a cathode of the first comparator diode is connected to the anode of the output diode, an emitter of the npn-bipolar transistor is connected to a second electrode of the timer element capacitor, an emitter of the pnp-bipolar transistor is connected via the third comparator resistor to a second terminal of the timer element resistor, and a base of the pnp-bipolar transistor is connected to a cathode of the second comparator diode.

2. A method for protecting the semiconductor switch having the gate controlled by the gate driver with the protection circuit according to claim 1, the method comprising: detecting the gate charge of the gate, and switching the semiconductor switch off, when the gate charge falls below the time-independent reference charge after a minimum time has elapsed after the semiconductor switch has been switched on.

3. A protection circuit for a semiconductor switch, the semiconductor switch having a gate which is controllable by a gate driver, the protection circuit comprising:
an integrator connected to the gate and detecting a gate charge of the gate based on an integrator output voltage of the integrator,
a comparator unit for switching off the semiconductor switch when the gate charge falls below a reference charge, the comparator unit comprising a comparator operational amplifier having a positive input, a negative input and an output, and a comparator diode, and
a reference charge circuit comprising a reference charge capacitor, a reference charge resistor, a first reference charge diode and a second reference charge diode, wherein the reference charge circuit is configured to increase the reference charge during a rise time from zero to a final value, after the semiconductor switch is switched-on,
wherein the positive input of the comparator operational amplifier is connected to an output of the integrator, the negative input of the comparator operational amplifier is connected to a first terminal of the reference charge resistor, to a first electrode of the reference charge capacitor and to an anode of the first reference chare diode, and
wherein the output of the comparator operational amplifier is connected to a cathode of the comparator diode a cathode of the first reference charge diode is connected to a cathode of the second reference chare diode, and an anode of the second reference charge diode is connected to an input of the integrator.

4. The protection circuit of claim 3, wherein the rise time is selected such that a gate capacitance and a Miller capacitance of the semiconductor switch, at an end of the rise time and after the semiconductor switch has switched into the normal operation, are recharged substantially completely, but at least 90%.

5. A method for protecting the semiconductor switch having the gate controlled by the gate driver with the protection circuit according to claim 3, the method comprising:
   detecting the gate charge of the gate, and
   switching the semiconductor switch off depending on a value of the gate charge relative to the reference charge,
   wherein the reference charge is increased during a rise time from zero to a final value after the semiconductor switch is switched-on and the semiconductor switch is switched off when the gate charge falls below the reference charge.

6. A circuit arrangement, comprising
   a semiconductor switch with a gate,
   a gate driver for controlling the gate, wherein the gate driver has an electronic switching unit controlled by a driver voltage of the gate driver and connected to the gate for switching-on the semiconductor switch with a switch-on potential and for switching off the semiconductor switch with a switch-off potential, and
   a protection circuit comprising
   an integrator connected to the gate and detecting a gate charge of the gate based on an integrator output voltage of the integrator,
   a comparator unit for switching off the semiconductor switch when the gate charge falls below a time-independent reference charge, the comparator unit comprising a pnp-bipolar transistor, an npn-bipolar transistor having a collector connected to a base of the pnp-bipolar transistor, a first comparator diode, a second comparator diode, a comparator capacitor, a first comparator resistor, a second comparator resistor and a third comparator resistor and to an anode of the first comparator diode, with the comparator capacitor and the first comparator resistor each connected in parallel with a base-emitter path of the pnp-bipolar transistor, and with the second comparator resistor connected in parallel with a base-emitter path of the npn-bipolar transistor, and
   a timer element for setting a minimum duration between a switching-on of the semiconductor switch by the comparator unit and a switching-off of the semiconductor switch by the comparator unit, wherein the minimum duration is selected such that, during the minimum duration, a gate capacitance and a Miller capacitance of the semiconductor switch, after the semiconductor switch into a normal operation, are substantially completely, but at least 90%, recharged,
   wherein the timer element comprises a timer element resistor, a timer element capacitor and a timer element diode, wherein an anode of the timer element diode is connected to a first terminal of the timer element resistor and to a first electrode of the timer element capacitor, and an output of the integrator is connected to a cathode of an output diode, with an anode of the output diode being connected to the anode of the timer element diode, to the first terminal of the timer element resistor and to the first electrode of the timer element capacitor, and
   wherein a cathode of the first comparator diode is connected to the anode of the output diode, an emitter of the npn-bipolar transistor is connected to a second electrode of the timer element capacitor, an emitter of the pnp-bipolar transistor is connected via the third comparator resistor to a second terminal of the timer element resistor, and a base of the pnp-bipolar transistor is connected to a cathode of the second comparator diode.

7. The circuit arrangement of claim 6, wherein the emitter of the npn-bipolar transistor is connected to the switch-off potential, the second terminal of the timer element resistor is connected to the switch-on potential and an anode of the second comparator diode is connected to a control input of the electronic switching unit.

* * * * *

UNITED STATES PATENT AND TRADEMARK OFFICE
CERTIFICATE OF CORRECTION

| | |
|---|---|
| PATENT NO. | : 11,942,926 B2 |
| APPLICATION NO. | : 17/440377 |
| DATED | : March 26, 2024 |
| INVENTOR(S) | : Norbert Stadter |

It is certified that error appears in the above-identified patent and that said Letters Patent is hereby corrected as shown below:

In the Claims

Column 12, Claim 3, Line 58: replace "chare" with --charge--;
Column 12, Claim 3, Line 63: replace "chare" with --charge--.

Signed and Sealed this
Fourteenth Day of May, 2024

Katherine Kelly Vidal
*Director of the United States Patent and Trademark Office*